(12) United States Patent
Enichlmair

(10) Patent No.: US 8,592,910 B2
(45) Date of Patent: Nov. 26, 2013

(54) SEMICONDUCTOR BODY WITH A PROTECTIVE STRUCTURE AND METHOD FOR MANUFACTURING THE SAME

(75) Inventor: Hubert Enichlmair, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 13/119,759

(22) PCT Filed: Sep. 16, 2009

(86) PCT No.: PCT/EP2009/062029
§ 371 (c)(1),
(2), (4) Date: Jul. 22, 2011

(87) PCT Pub. No.: WO2010/031798
PCT Pub. Date: Mar. 25, 2010

(65) Prior Publication Data
US 2011/0298104 A1    Dec. 8, 2011

(30) Foreign Application Priority Data

Sep. 18, 2008  (DE) .................. 10 2008 047 850

(51) Int. Cl.
*H01L 23/62* (2006.01)
*H01L 29/72* (2006.01)
*H01L 29/74* (2006.01)
*H01L 31/111* (2006.01)
*H01L 29/73* (2006.01)

(52) U.S. Cl.
USPC ........... 257/355; 257/173; 257/174; 257/356; 257/357; 257/358; 257/359; 257/360; 257/361; 257/362; 257/363; 438/223; 438/224; 438/27; 438/228

(58) Field of Classification Search
USPC .......... 257/355–363, 173–174; 438/223–224, 438/227–228
See application file for complete search history.

(56) References Cited

U.S. PATENT DOCUMENTS 5,235,201 A * 8/1993 Honna ........................ 257/357
5,326,994 A * 7/1994 Giebel et al. ................. 257/174

(Continued)

FOREIGN PATENT DOCUMENTS

GB   2 339 074      1/2000
WO   WO 2007/084688  7/2007

OTHER PUBLICATIONS

T. Nikolaidis et al., "Transmission gate switch for ESD protection of RF pad", Electronics Letters, IEEE Stevenage, pp. 318-319, XP006017978, Mar. 28, 2002.

*Primary Examiner* — Ida M Soward
(74) *Attorney, Agent, or Firm* — McDermott Will & Emery LLP

(57) ABSTRACT

A semiconductor body includes a protective structure. The protective structure (10) includes a first and a second region (11, 12) which have a first conductivity type and a third region (13) that has a second conductivity type. The second conductivity type is opposite the first conductivity type. The first and the second region (11, 12) are arranged spaced apart in the third region (13), so that a current flow from the first region (11) to the second region (12) is made possible for the limiting of a voltage difference between the first and the second region (11, 12). The protective structure includes an insulator (14) that is arranged on the semiconductor body (9) and an electrode (16) that is constructed with floating potential and is arranged on the insulator (14).

14 Claims, 5 Drawing Sheets

(56) References Cited

U.S. PATENT DOCUMENTS

| | | | |
|---|---|---|---|
| 5,670,814 A * | 9/1997 | Wu et al. | 257/360 |
| 5,994,741 A * | 11/1999 | Koizumi et al. | 257/355 |
| 6,118,154 A | 9/2000 | Yamaguchi | |
| 6,215,157 B1 * | 4/2001 | Fukuda | 257/362 |
| 6,459,127 B1 * | 10/2002 | Lee et al. | 257/355 |
| 6,555,877 B2 * | 4/2003 | Imam et al. | 257/355 |
| 6,559,469 B1 * | 5/2003 | Paz de Araujo et al. | 257/15 |
| 6,582,997 B1 * | 6/2003 | Lee et al. | 438/208 |
| 6,853,038 B2 * | 2/2005 | Hayashi | 257/369 |
| 6,885,529 B2 * | 4/2005 | Ker et al. | 361/56 |
| 7,071,528 B2 * | 7/2006 | Ker et al. | 257/492 |
| 7,285,827 B1 * | 10/2007 | He et al. | 257/355 |
| 7,323,753 B2 * | 1/2008 | Henmi et al. | 257/379 |
| 7,345,345 B2 * | 3/2008 | Ando et al. | 257/357 |
| 7,446,378 B2 * | 11/2008 | Bakker | 257/355 |
| 7,639,464 B1 * | 12/2009 | Vashchenko et al. | 361/56 |
| 7,709,924 B2 * | 5/2010 | Voldman | 257/490 |
| 7,796,443 B2 * | 9/2010 | Berco | 365/185.29 |
| 7,999,327 B2 * | 8/2011 | Kitahara | 257/371 |
| 2004/0164354 A1 | 8/2004 | Mergens et al. | |
| 2005/0073024 A1 * | 4/2005 | Frey et al. | 257/530 |
| 2005/0121725 A1 | 6/2005 | Ando et al. | |
| 2005/0205937 A1 | 9/2005 | Wang | |
| 2006/0138544 A1 * | 6/2006 | Bakker | 257/355 |
| 2006/0258067 A1 * | 11/2006 | Jeon et al. | 438/154 |
| 2007/0120173 A1 * | 5/2007 | Lojek | 257/315 |
| 2007/0145467 A1 * | 6/2007 | Park et al. | 257/315 |
| 2007/0148851 A1 * | 6/2007 | Kim et al. | 438/201 |
| 2007/0215949 A1 * | 9/2007 | Kijima | 257/355 |
| 2007/0223162 A1 | 9/2007 | Naot et al. | |
| 2008/0128756 A1 * | 6/2008 | Satoh | 257/203 |
| 2009/0201742 A1 * | 8/2009 | Lee et al. | 365/185.24 |

* cited by examiner

SEMICONDUCTOR BODY WITH A PROTECTIVE STRUCTURE AND METHOD FOR MANUFACTURING THE SAME

This is a U.S. national stage of application No. PCT/EP2009/062029, filed on Sep. 16, 2009, and claims priority on German application No. 10 2008 047 850.4, filed on Sep. 18, 2008, the entire content of which is hereby incorporated by reference.

FIELD OF THE INVENTION

The present invention relates to a semiconductor body with a protective structure, as well as to a method for the production of a protective structure in a semiconductor body.

BACKGROUND OF THE INVENTION

Semiconductor bodies that have an integrated circuit are subjected to environmental influences. Lightning, static charges, and electromagnetic pollution can lead to electrostatic discharges, abbreviated ESD, on the semiconductor body through which an integrated circuit can be destroyed. Typically, the structures which are to be protected are connected via a diode to a reference potential terminal, so that an undesired and destructive charge can be discharged.

Document U.S. Pat. No. 6,118,154 relates to an input/output protective circuit. The protective circuit comprises a p-channel and an n-channel metal oxide semiconductor transistor. The potentials of the gate electrodes of both transistors are floating.

In the documents WO 2007/084688 A1 and US 2005/0121725 A1, other protective structures are described.

SUMMARY OF THE INVENTION

One object of the invention is to provide a semiconductor body with a protective structure and a method for the production of a protective structure in a semiconductor body that allow an effective reduction of a voltage above a threshold.

In one embodiment, a semiconductor body comprises a protective structure. The protective structure comprises a first and a second region that have a first conductivity type. The protective structure further comprises a third region with a second conductivity type. The first and the second region are arranged spaced apart in the third region. The second conductivity type is opposite the first conductivity type. In addition, the protective structure comprises an insulator that is arranged on the semiconductor body and an electrode that is arranged on the insulator. The electrode is constructed for operation with floating potential. A current flow from the first region to the second region is made possible. The current flow can limit a voltage difference between the first and the second region.

Advantageously, for a structure that has a first pn-junction between the first and the third region and also a second pn-junction between the second and the third region, a threshold can be set precisely above which a voltage between the first and the second region is reduced. The threshold could be defined by a voltage value above which a breakdown occurs between the first and the second region. Thus, the protective structure can reduce voltage peaks that occur for an ESD event to a value in which a permanent functionality of a structure that is to be protected is guaranteed.

Instead of the electrode being constructed for operation with floating potential, the electrode could be completely encapsulated by insulating material.

In one embodiment, the semiconductor body has a first surface on which the first, the second, and third region are arranged. Due to the arrangement of the three regions on the first surface, in one embodiment, surface effects could be used for the control of a current flow between the first and the second region.

In one embodiment, the third region is constructed as a first well.

In one embodiment, the third region could be realized such that it has a floating potential. The third region has no substrate connection. No substrate or well voltage is fed to the third region. In one embodiment, in the operation, a potential of the third region is set in which the likelihood of a danger to the protective structure from overvoltage is reduced.

The semiconductor body could comprise a deep well in which the third region is arranged. Advantageously, in this way the insulation of the third region to a substrate of the semiconductor body is increased.

In one embodiment, the protective structure can comprise a channel region that is arranged between the first and the second region. The channel region is arranged in the third region. A channel length of the channel region is thus the distance between the first and the second region. The channel length can have a value less than 5 μm. Preferably, the channel length can have a value less than 1 μm.

The insulator could be arranged on the channel region. Preferably, the insulator could have a silicon oxide. The silicon oxide could be realized as gate insulator layer.

In one embodiment, the electrode is completely electrically insulated. Here, the electrode could be encapsulated completely by the insulating material. Through the encapsulation of the electrode with insulating material, a charging or a discharging of the electrode by means of creep currents can be reduced. The electrode is not connected electrically to the outside. The electrode could be constructed as a gate electrode.

The electrode could form an equipotential area above the channel region. The equipotential area can influence the electrical field distribution in the channel region and consequently also a current flowing between the first and the second region.

The protective structure could involve the field-effect transistor principle. The protective structure could be realized as a field-effect transistor. In contrast to a typical field-effect transistor, the electrode of the protective structure is constructed with a floating potential. Because the conductivity type of the first and the second region differ from the conductivity type of the third region, the protective structure has a pnp structure or an npn structure. Therefore, the protective structure could exhibit a bipolar effect. Due to the small distance of the first region to the second region, the protective structure could have a performance of a bipolar transistor with a high amplification factor.

In one embodiment, the semiconductor body likewise comprises the structure that is to be protected. The structure that is to be protected could be realized as a bipolar transistor. Preferably, the structure that is to be protected could be realized as field-effect transistor. The field-effect transistor could be realized as metal oxide semiconductor field-effect transistor, abbreviated MOSFET. In one embodiment, the protective structure could protect an electrode and an insulator of a MOSFET. The electrode could be designated as gate. The insulator could be named gate insulator. Therefore, the protective structure could also be designated as gate clamp. Here, the maximum permissible voltage on the control terminal of the structure that is to be protected could equal, for example, 3.3 volts.

The structure that is to be protected could be arranged in the semiconductor body comprising the protective structure outside of the third region. The semiconductor body could have a fourth region in which the structure that is to be protected is arranged. The fourth region could have the second conductivity type. The fourth region could be realized as a second well. The fourth region could have a well or substrate terminal.

In one refinement, the semiconductor body has a first path conductor that is connected to the first region of the protective structure and a second path conductor that is connected to the second region of the protective structure. The first path conductor can connect the first region to a terminal of the structure that is to be protected. The second path conductor can further connect the second region of the protective structure to a supply voltage terminal. Thus, a charge located on the terminal of the structure that is to be protected can be discharged via the protective structure to the supply voltage terminal. Preferably, a charge is discharged to the supply voltage terminal. In this way it is avoided that the charge is fed to the terminal of the structure that is to be protected. The supply voltage terminal can be realized as a reference potential terminal. The supply voltage terminal can alternatively lie at a potential deviating from the reference potential. For example, a positive or a negative supply voltage could be fed to the supply voltage terminal.

In one embodiment, the electrode is connected to the first or the second path conductor. Thus, the electrode is not electrically insulated. The potential of the electrode is defined by the potential of the first or second path conductor.

In one embodiment, the second path conductor connects the second region to the substrate terminal of the fourth region. The protective structure can be connected via the two path conductors to the electrode of the structure that is to be protected and to the substrate terminal of the structure that is to be protected.

The structure that is to be protected can have a first and a second region with the first conductivity type. A processing step for the production of the doping of the first and the second region of the structure that is to be protected can likewise be used for the production of the doping of the first and second region of the protective structure.

In one embodiment, the field-effect transistor of the structure that is to be protected has an insulator. The production of the insulator of the structure that is to be protected can be performed simultaneously and with the same processing steps as the production of the insulator of the protective structure.

The field-effect transistor of the structure that is to be protected can have an electrode that is arranged on the insulator. The electrode of the structure that is to be protected can be produced simultaneously and with the same processing steps as the electrode of the protective structure. The protective structure can be connected via the first path conductor to the electrode of the structure that is to be protected.

In one embodiment, a method for the production of a semiconductor body with a protective structure comprises the production of a first and a second region in the semiconductor body. The first and second regions have a first conductivity type. The protective structure comprises the first and the second region. The first and the second region are arranged in a third region that has the second conductivity type. The first and the second region are arranged spaced apart from each other on the semiconductor body such that a current flow from the first to the second region is simplified for the limiting of a voltage difference between the two regions. The method further comprises the production of an insulator of the protective structure on the semiconductor body and an electrode of the protective structure on the insulator, such that, for the operation, the electrode is constructed with floating potential.

Advantageously, a voltage between the first and the second region can be limited by means of the pn-junction between the first region and the third region as well as by means of the pn-junction between the second region and the third region.

In one embodiment, the method comprises the production of a deep well.

In one embodiment, the deep well has a depth with a value from a range between 4 µm and 12 µm. The depth can refer to a first surface of the semiconductor body. The first surface can separate the insulator from a semiconductor material of the semiconductor body. A pn-junction that separates the deep well from a substrate of the semiconductor body can thus have a distance to the first surface with a value from a range between 4 µm and 12 µm. The deep well can have a dopant concentration between $5 \times 10^{15}/cm^3$ and $5 \times 10^{16}/cm^3$.

In one embodiment, the method comprises the production of the third region. The third region can be arranged in the deep well. The third region can be constructed as a first well. The third region can have a floating potential.

In one embodiment, the third region has a depth from a range between 0.5 µm and 2 µm. A pn-junction that separates the third region from the deep well can thus have a distance to the first surface with a value from a range between 0.5 µm and 2 µm. The third region can have a dopant concentration between $5 \times 10^{16}/cm^3$ and $5 \times 10^{17}/cm^3$.

The electrode can be encapsulated completely by insulating material.

In one embodiment, the method comprises the production of the deep well, then the production of the third region, and then the production of the insulator, the electrode, and also the first and the second region. Additional production steps can be performed between the listed steps.

In one refinement, the method also comprises the production of a structure that is to be protected in the semiconductor body. Here, processing steps for the production of the structure that is to be protected are used as processing steps for the production of the protective structure.

In one embodiment of the refinement, the first and the second region of the protective structure are produced simultaneously with a first and a second region of the structure that is to be protected.

In one embodiment, for the production of the protective structure, an insulator layer is produced on the semiconductor body. An electrode layer is deposited on the insulator layer. By means of a photolithographic process and at least one subsequent etching process, the electrode layer and the insulator layer are structured such that the electrode and the insulator of the protective structure are produced. Furthermore, dopants are introduced into the semiconductor body, wherein the electrode of the protective structure is used as masking for the introduction of the dopants for the production of the first and second region of the protective structure. The introduction of the dopants can be performed preferably by means of ion implantation.

Furthermore, the method could comprise a production of a first path conductor that connects the first region of the protective structure to a terminal of the structure that is to be protected. Furthermore, the production of the semiconductor body could comprise the production of a second path conductor that connects the second region with a supply potential terminal.

In summary, embodiments of the invention has advantages:
  As processing steps for the production of the protective structure, exclusively processing steps are used that are otherwise used for the production of a structure that is to be protected and located on the same semiconductor body as the protective structure. For the production of the protective structure, steps for the production of a circuit with bipolar transistors can be used. Alternatively, for the production of the protective structure, steps for the production of a circuit with complementary metal oxide semiconductor transistors, abbreviated CMOS transistors, can be used.

For the production of the protective structure, masks are used that are otherwise needed for the production of the structure that is to be protected. No other masks are required.

A small leakage current between the first and the second region is achieved for an operating voltage below a limiting value. The limiting value can equal, for example, 4 volts.

Above the limiting value, a high value for a current through the protective structure is achieved, so that an upper value of a voltage occurring on the structure that is to be protected is determined by the protective structure. For example, the upper value could be 5 volts.

The protective structure could be realized in a third region that has a floating potential. In this way, a risk to the protective structure by an ESD event is reduced.

The protective structure could be used in an insulated logic circuit in which a deep well, inside which the third region is arranged, can be operated at voltages, for example, up to 50 volts.

BRIEF DESCRIPTION OF THE DRAWINGS

The invention will be explained in detail below using several embodiments with reference to the figures. Areas and structures with identical function or effect carry identical reference symbols. In so far as areas or structures correspond in their function, their description will not be repeated in each of the following figures. Shown are.

DETAILED DESCRIPTION OF THE DRAWINGS

Figure 1A:
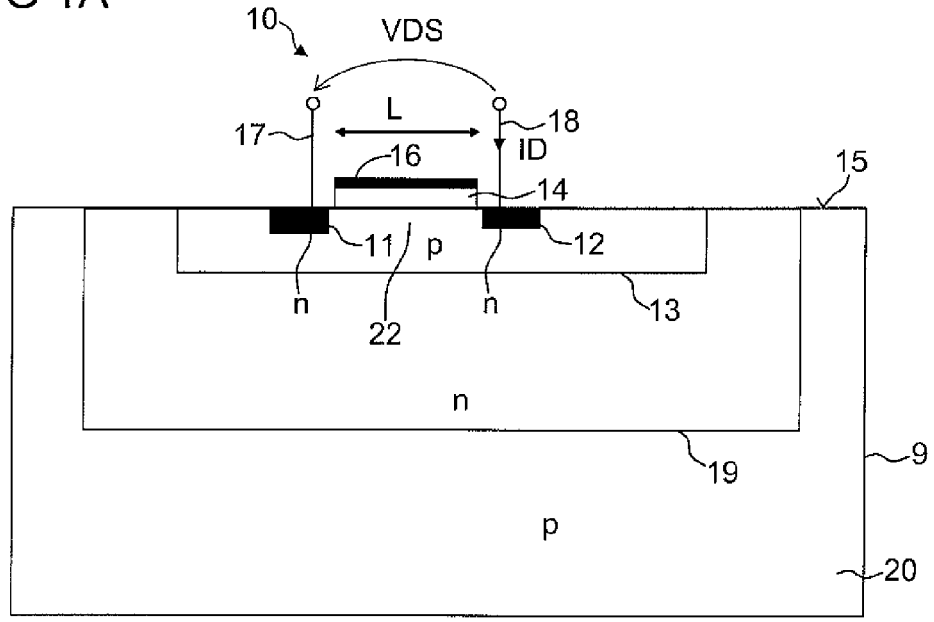
FIGS. 1A to 1D are example embodiments of a semiconductor body with a protective structure according to the invention, shown, in cross section.

FIG. 1A shows a semiconductor body 9 that comprises an example protective structure 10 according to the invention. The protective structure 10 has a first and a second region 11, 12. The first and the second regions 11, 12 are arranged spaced apart from each other. Furthermore, the semiconductor body 10 comprises a third region 13. In the third region 13, the first and the second regions 11, 12 are arranged. The third region 13 can be designated as shallow well. The depth of the third region 13 has, for example, a value of 1 μm. Between the first and the second region 11, 12, a channel region 22 is arranged. The distance between the first and the second region 11, 12 has a value L. The value L is thus the channel length of the channel region 22. The value L equals, for example, 0.35 μm. The semiconductor body 9 comprises an insulator 14. The insulator 14 is arranged on a first surface 15 of the semiconductor body 10. The insulator 14 is arranged on a subregion of the third region 13. The insulator 14 covers the channel region 22. On the insulator 14, an electrode 16 is arranged. The electrode 16 covers the insulator 14 between the first and the second regions 11, 12.

The semiconductor body 9 comprises a first and a second path conductor 17, 18. The first region 11 is attached to the first path conductor 17 and the second region 12 is attached to the second path conductor 18. The electrode 16 is not attached to a path conductor. The electrode 16 is also not contacted in any way. The electrode 16 is completely enveloped by the insulator 14 and other not-shown insulator layers. The electrode 16 is insulated electrically from all of the path conductors in the semiconductor body 9. The electrode 16 thus has a floating potential. In addition, the semiconductor body 10 comprises a deep well 19. The deep well 19 also comprises the third region 13. The semiconductor body 9 comprises a substrate 20. The deep well 19 is arranged in the substrate 20. The deep well 19 is more than 2 μm deep. The deep well 19 is, for example, 6 μm deep.

The first and the second region 11, 12 have a first conductivity type. The first and the second region 11, 12 are highly doped. The third region 13 has a second conductivity type. The second conductivity type is opposite the first conductivity type. The deep well 19 has the first conductivity type. Furthermore, the substrate 20 has the second conductivity type. The first conductivity type is n-conductive, that is, electrons are the majority charge carriers in the respective region. Accordingly, the second conductivity type is p-conductive, that is, holes are the majority charge carriers in the respective region. The first and the second regions 11, 12 are n-doped. The third region 13 is p-doped. The third region 13 has a doping level of approximately $7 \times 10^{16}/cm^3$. The deep well 19 is n-doped. The deep well 19 has, for example, a doping level of approximately $1 \times 10^{16}/cm^3$. The substrate 20 is p-doped.

The protective structure 10 is constructed as n-channel transistor. The insulator 14 is realized as silicon-dioxide layer. A thickness of the insulator 14 can equal, for example, 7 nm. The insulator 14 is constructed as gate insulator. The electrode 16 contains polysilicon. The polysilicon of the electrode 16 is n-doped. The electrode 16 is realized as gate electrode. The third region 13 is constructed with a floating potential. Thus, the third region 13 has no ohmic contact to a path conductor. The third region 13 is connected exclusively via pn-junctions to the first or second regions 11, 12 and thus to a path conductor. Furthermore, the third region 13 is connected by means of another pn-junction to the deep well 19. The channel region 22 is completely encapsulated by pn-junctions or insulators, such as the insulator 14. The protective structure 10 is similar to a MOSFET. The first and the second region 11, 12 correspond to a source and a drain area of a MOSFET. The insulator 14 corresponds to a gate insulator of a MOSFET. The electrode 16 differs from an electrode of a MOSFET in that it is constructed with floating potential. The third region 13 corresponds to a substrate or a well in which the source and the drain area of a MOSFET are arranged with the difference that the third region 13 is constructed with floating potential and the substrate or the well of the MOSFET is constructed, in general, with a defined potential.

The protective structure 10 has an npn structure that is formed by the first region 11, the channel region 22, and the second region 12. The protective structure 10 is operated in this arrangement as a bipolar transistor. The channel region 22 can be designated as base of the bipolar transistor. The first region 11 can be designated as emitter and the second region 12 can be designated as collector of the bipolar transistor. The distance from emitter to collector is the channel length L. The distance is on the order of magnitude of typical collector-emitter distances. The bipolar transistor has an open base terminal. The third region 13 can be designated as open base terminal.

Through the use of a thermally generated silicon oxide for the insulator 14 and of polysilicon for the electrode 16, a low density of traps is produced in the oxide of the insulator 14 compared, for example, with silicon oxide layers that are used for a field insulation. During the operation as protective structure 10, a current flows via a reverse-biased pn-junction close to the first surface 15. This current flows into the space charge zone in the channel region 22 between the first and the second regions 11, 12. The current leads to the formation of boundary surface and oxide traps close to the first surface 15 of the semiconductor body 9. The density of the traps depends on the properties of the insulator 14. The insulator 14 is thermally produced. The increase of a leakage current and the decrease of the breakdown voltage through the formation of boundary surface and oxide traps are reduced by the use of a thermally oxidized insulator 14.

A breakdown voltage between the first path conductor 17 and the second path conductor 18 is determined by a breakdown voltage between collector and emitter for open base, abbreviated BVCEO. The breakdown voltage BVCEO is a function of a breakdown voltage between the first region 11 and the third region 13 or between the second region 12 and the third region 13, as well as a bipolar amplification factor. The amplification factor reduces the breakdown voltage BVCEO considerably. The distance between the first and the second region 11, 12 is the channel length L that equals, for example, 0.35 µm. A bipolar amplification factor of approximately 100 is sufficient, in order to reduce the breakdown voltage between the highly doped area of the first region 11 and the third region 13, as well as the breakdown voltage between the highly doped area of the second region 12 and the third region 13. Because the amplification factor is determined by the channel length L, from a more precise observance of the channel length L, a precise setting of the amplification factor and thus the breakdown voltage BVCEO between the first and the second area 11, 12 is produced. The deviations in length of the channel length L, L' are monitored precisely during the production, so that the deviations of the amplification factor are very low.

In one not-shown embodiment, the first conductivity type could be p-conductive and the second conductivity type could be n-conductive.

Figure 1B:
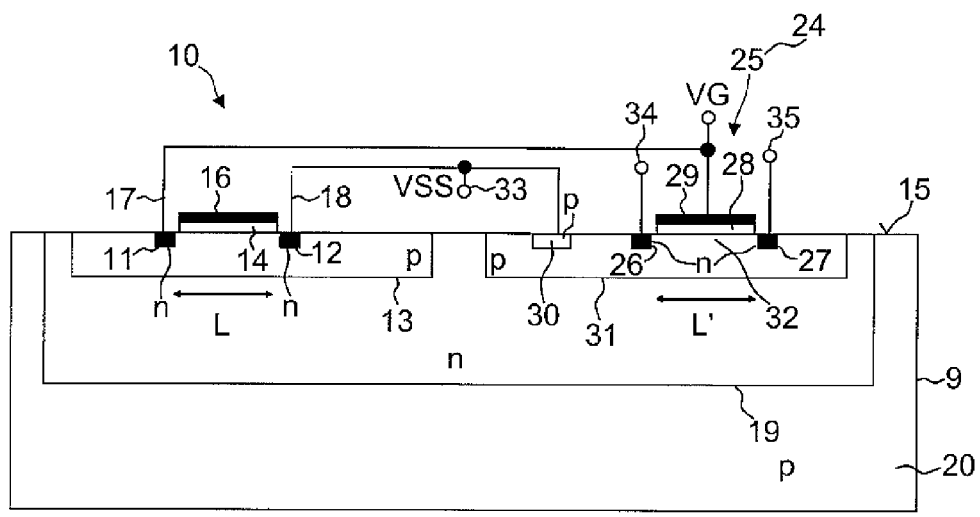

FIG. 1B shows another example embodiment of a semiconductor body with a protective structure according to the invention. The embodiment is a refinement of the semiconductor body according to FIG. 1A. The semiconductor body 9 has the protective structure 10 according to FIG. 1A. In addition, the semiconductor body 9 comprises a structure 24 that is to be protected. The structure 24 that is to be protected comprises a transistor 25. The transistor 25 is constructed as MOSFET. The transistor 25 is realized as re-channel transistor. The transistor 25 comprises a first and a second region 26, 27. The first and the second region 26 of the transistor 25 are connected to a third or a fourth path conductor 34, 35. Furthermore, the transistor 25 comprises an insulator 28 and an electrode 29. A channel region 32 is arranged between the first and the second region 26, 27 of the transistor 25. The channel region 32 has a channel length L'. The channel length L and also the channel length L' can have the same value. Furthermore, the semiconductor body 9 has a substrate terminal 30.

In addition, the semiconductor body 9 comprises a fourth region 31. The deep well 19 comprises the fourth region 31. In the fourth region 31, the transistor 25 is realized. The first and the second region 26, 27 are thus doped regions in the fourth region 31. The substrate terminal 30 is constructed for the contacting of the fourth region 31. A supply voltage terminal 33 can be connected to the substrate terminal 30. Because the substrate terminal 30 is arranged in the fourth region 31, the substrate terminal 30 can also be designated as well terminal. The first and the second region 26, 27 of the transistor 25 have the first conductivity type. The fourth region 31 has the second conductivity type. The substrate terminal 30 likewise has the second conductivity type. The substrate terminal 30 is used for a low-impedance terminal of the supply voltage terminal 33 to the fourth region 31.

The first path conductor 17 of the protective structure 10 is connected to the electrode 29 of the transistor 25. The second path conductor 18 is connected to the supply voltage terminal 33 and thus to the substrate terminal 30.

A supply voltage can be tapped at the supply voltage terminal 33. The supply voltage can have the value of a reference potential VSS. The reference potential VSS can have the smallest potential that is given in the semiconductor body.

The protective structure 10 and the transistor 25 are produced with the same processing steps. Thus, the thickness of the insulator 28 of the transistor 25 is equal to a thickness of the insulator 14 of the protective structure 10. If a charge reaches the electrode 29 of the transistor 25, then the charge is discharged via the first path conductor 17, the first region 11, the channel region 22, the second region 12, and the second path conductor 18 to the supply voltage terminal 33.

Advantageously, the protective structure 10 and the structure 24 that is to be protected are arranged in two different wells, namely in the third region 13 and in the fourth region 31. The third and the fourth region 13, 31 do not contact each other. The two regions 13, 31 are insulated from each other. Also, voltages above 5 volts can be applied between the terminals 17, 18 of the protective structure 10 and the substrate 20.

Alternatively, the thickness of the insulator 28 of the transistor 25 is approximately equal to the thickness of the insulator 14 of the protective structure 10. The deviation can equal up to 10%.

Alternatively, the thickness of the insulator 28 of the transistor 25 has a smaller value than the thickness of the insulator 14 of the protective structure 10. The thickness of the insulator 28 of the transistor 25 can be, for example, 7 nm and the thickness of the insulator 14 of the protective structure 10 can be, for example, 15 nm.

In a not-shown embodiment, the deep well 19 comprises several regions that are implemented like the fourth region 31 and each have a transistor 25. If such a circuit has logic gates, it can be designated as isolated logic. An isolated logic circuit can comprise several transistors that are each arranged individually in the fourth region 31 or in not-shown, additional regions. The fourth region 31 and the other regions thus each have exactly one transistor 25. The fourth region 31 and the other regions are arranged in the deep well 19. In an isolated logic circuit, the transistors 25 belonging to the circuit are located in the same deep well 19. The deep well 19 is electrically insulated from the substrate 20 and thus can be operated at high electrical potential relative to the substrate 20.

Figure 1C:
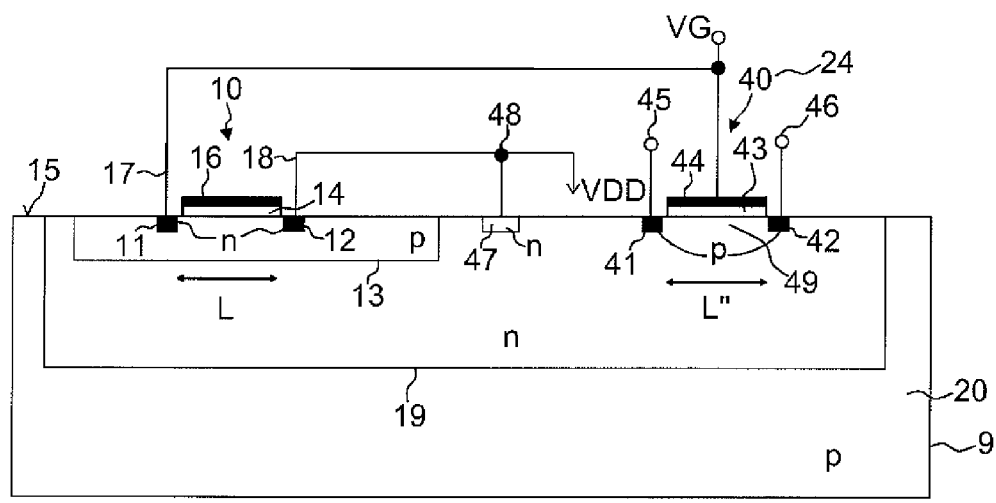

FIG. 1C shows another example embodiment of a semiconductor body with a protective structure according to the invention. The embodiment is a refinement of the semiconductor body according to FIGS. 1A and 1B. The semiconductor body 9 has the protective structure 10 according to FIG. 1A or 1B. In addition, the semiconductor body 9 has another transistor 40. The other transistor 40 comprises a first and a second region 41, 42. Between the first and the second region 41, 42 there is a channel region 49. In addition, the other transistor 40 comprises an insulator 43 and an electrode 44. The first and the second region 41, 42 of the other transistor 40 are attached to a fifth and to a sixth path conductor 45, 46, respectively. The electrode 44 is connected to the first path conductor 17. The second path conductor 18 is connected to another substrate terminal 47. The other substrate terminal 47 is arranged in the deep well 19. Furthermore, the second path conductor 18 and the other substrate terminal 47 are connected to another supply voltage terminal 48. The first and the second region 41, 42 of the other transistor 40 are of the second conductivity type. The other substrate terminal 47 has the first conductivity type. The other transistor 40 is thus realized as p-channel transistor. In FIG. 1C, the protected structure 24 comprises the other transistor 40.

A supply voltage can be tapped at the other supply voltage terminal 48. The supply voltage can have a value VDD that is positive relative to the reference potential. An undesired charge of the electrode 44 is fed via the protective structure 10 to the other supply voltage terminal 48. The Protective structure 10 according to FIGS. 1B and 10 is realized as a lateral protective structure.

Figure 1D:
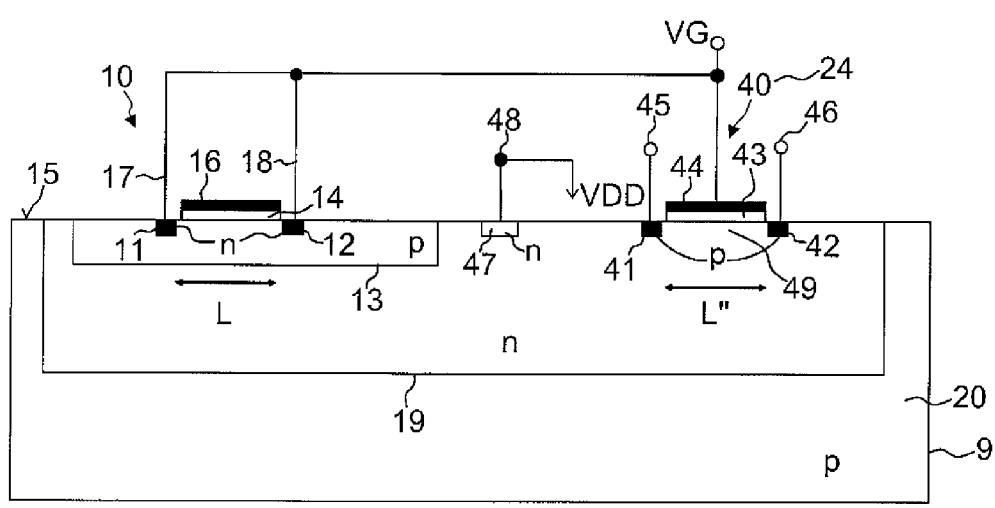

FIG. 1D shows another example embodiment of a semiconductor body with a protective structure according to the invention. The embodiment is a refinement of the semiconductor body according to FIGS. 1A to 1C. The semiconductor body 9 has the protective structure 10 according to FIGS. 1A to 1D. However, in contrast to the embodiments that are shown in FIGS. 1A to 1C, the first path conductor 17 is connected in an electrically conductive way to the second path conductor 18. The second path conductor 18 is not connected to the other supply terminal 48 and thus also not to the other substrate terminal 47. The protective structure 10 in FIG. 1D is realized as vertical protective structure.

In an alternative embodiment not shown in FIGS. 1A to 1D, the deep well 19 comprises other complementary metal oxide semiconductor transistors, abbreviated CMOS transistors. The other transistors can be realized like the transistor 25 according to FIG. 1B that is an n-channel transistor or like the other transistor 40 according to FIG. 1C or 1D that is a p-channel transistor.

Advantageously, the protective structure 10 can be used for the protection of the structure 24 that is to be protected, even if the two structures 10, 24 are realized differently. While both structures 10, 24 in FIG. 1B are realized as re-channel transistors, in FIGS. 1C and 1D the protective structure 10 is constructed as n-channel transistor and the structure 24 that is to be protected is constructed as p-channel transistor.

In an alternative, not-shown embodiment, the electrode 16 is attached to the first or the second path conductor 17, 18. Thus, the electrode 16 is not electrically floating. A voltage applied to the first or second path conductor 17, 18 defines the voltage applied to the electrode 16.

In an alternative, not-shown embodiment of the semiconductor body 9 according to FIGS. 1A to 1D, the deep well 19 is eliminated. In this case, the substrate 20 of the semiconductor body 9 has the first conductivity type. The substrate is thus n-doped.

In an alternative, not-shown embodiment of the semiconductor body 9 according to FIGS. 1A to 1D, the first conductivity type is p-conductive and the second conductivity type is n-conductive. Thus, all of the regions, areas, and electrodes of the semiconductor body 9 are doped inverse relative to the details in FIGS. 1A to 1D. Here, a doping with a donor is replaced by a doping with an acceptor and vice versa.

Figure 2:
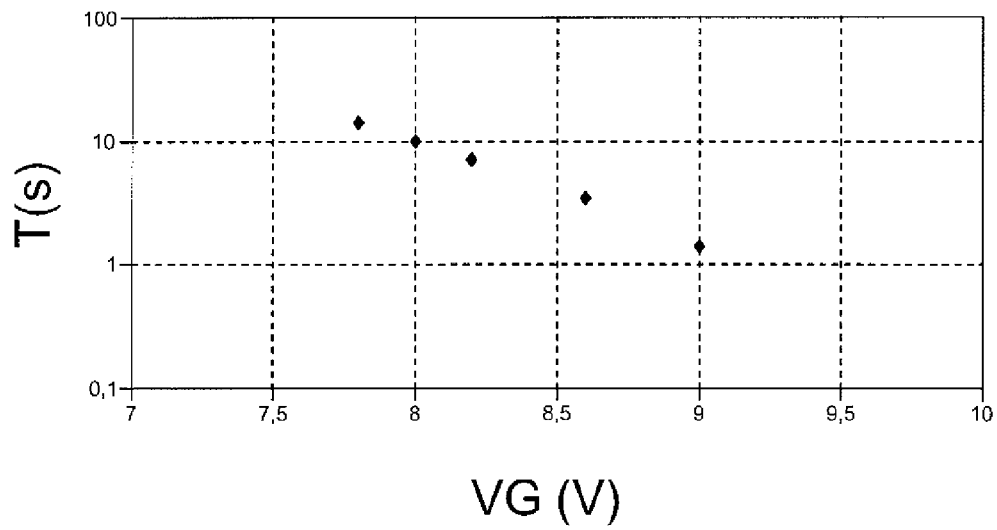
FIG. 2 is an exemplary embodiment showing a diagram of a period within which a shift of a threshold voltage of a transistor is caused by a voltage applied to the transistor on a magnitude of the applied voltage.

FIG. 2 shows an exemplary embodiment showing a diagram of a period T within which a shift of a threshold voltage of a transistor is caused by a voltage applied to the transistor on a magnitude of the applied voltage. The period T is the period in which the applied voltage VG causes a relative shift of a threshold voltage of the transistor by 10%. The voltage VG is applied to an electrode of a MOSFET and thus can be designated as control voltage. For example, the control voltage VG can be fed to the electrode 29 of the transistor 25. The measurements were performed on n-channel MOSFET's.

The period T increases with falling voltage VG. A control voltage VG of 5 V can be applied at least several 100 see, while a 10% shift in threshold voltage is achieved. This effect can be clearly demonstrated at the 5V level by drawing a line through the measurement points in FIG. 2 and elongated to a point corresponding to 5V. A cause for the shift of the threshold voltage could be the Fowler-Nordheim tunneling.

A failure of a transistor could be caused by a dielectric breakdown. At a voltage of 5 V, the lifetime that is limited by the dielectric breakdown is much longer than the period T at which the 10% shift of the threshold voltage is caused.

Figure 3:
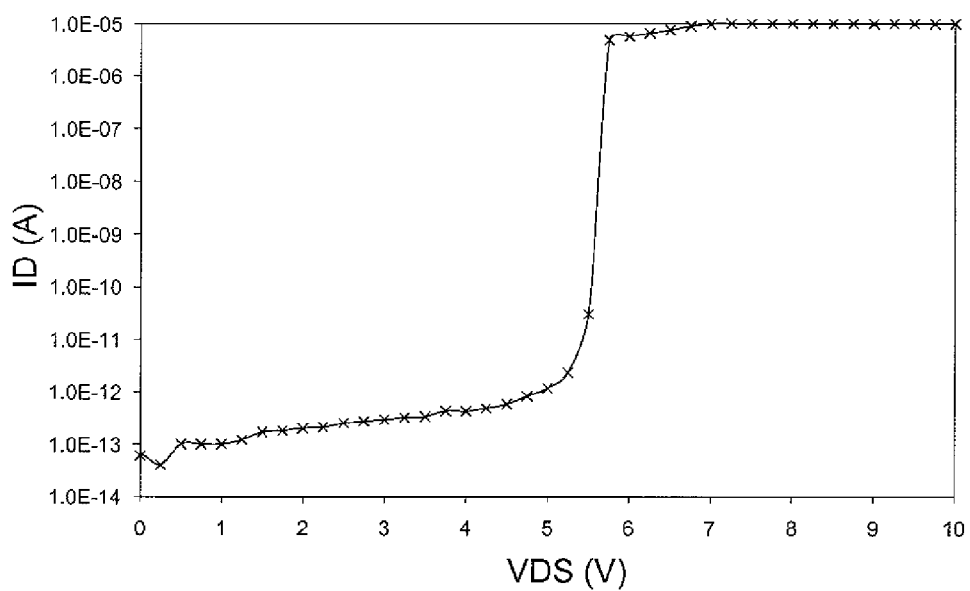
FIG. 3 is an exemplary embodiment showing a diagram of a current that flows through a protective structure on an applied voltage.

FIG. 3 shows an exemplary embodiment showing a diagram of a current ID that flows through a protective structure on an applied voltage VDS. The measurement curve according to FIG. 3 was determined at room temperature. In FIG. 3, a drain current ID that flows through the second path conductor 18 is plotted versus a drain-source voltage VDS that is applied between the first and the second path conductor 17, 18. In this arrangement, the third region 13, that is, the shallow p-well that represents the base, is not connected. Up to a value of 5 V for the drain-source voltage VDS, the current ID through the protective structure 10 is very low. Below this voltage, only very small currents flow that are lower than 1 µA. Thus, the protective structure 10 is high impedance for voltage regions in which a normal transistor can be used. The region can equal, for example, 0 V to 3.3 V. Thus, in the voltage range of the normal operation of the semiconductor body 9, no current flows through the protective structure 10, so that the normal function of a circuit that comprises the structure 24 that is to be protected is not changed and an additional energy consumption by the protective circuit 10 is very small.

In comparison, the current ID through the protective structure 10 is very high for higher values of the drain-source voltage VDS. The breakdown voltage between collector and emitter for open base BVCEO equals circa 5 V. In contrast, the breakdown between the first region 11 and the third region 13 takes place at approximately 10 V. Due to the physical mechanisms involved, such as avalanche breakdown, and a positive feedback due to the amplification by the bipolar effect, a very steep rise in the current is achieved when the voltage between the first and the second path conductor 17, 18 rises by 5 V. The breakdown voltage of 5 V is sufficient, in order to guarantee a high quality of an insulator 28 of a structure 24 that is to be protected.

In a not-shown semiconductor body, if a breakdown between a p-region and an n-region should already occur at lower voltage values, such as 5 V or 3.3 V, then this leads to undesired leakage currents.

The concept explained above is suitable to a protective structure 10 for maintaining a control voltage not only at a value of 3.3 V, but can also be set to different limiting values. Through changes in the distance L and/or the doping profiles of the third region 13 and/or the doping profiles of the first and second region 11, 12, higher or lower breakdown voltages are achieved.

The voltage VG on a structure 24 that is to be protected drops as drain-source voltage VDS across the protective structure 10 due to the coupling of the structure 24 that is to be protected with the protective structure 10. If the voltage VG across the structure 24 that is to be protected increases to a critical value, then the voltage VG quickly falls due to the high current flow through the protective structure 10.

Figure 4:
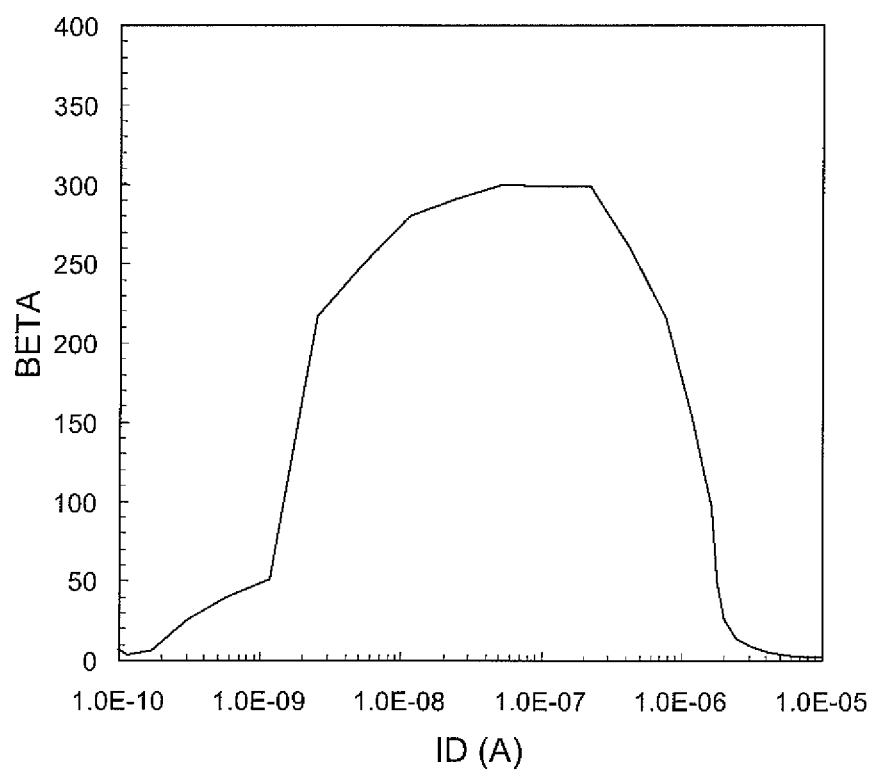
FIG. 4 is an exemplary embodiment showing a diagram of an amplification factor of a protective structure on a current that flows through the protective structure.

FIG. 4 shows an exemplary embodiment showing a diagram of an amplification factor BETA of a protective structure 10 on the current ID that flows through the protective structure 10. The first region 11 can be designated as emitter. Accordingly, the second region 12 can be named collector. The first and the second region 11, 12 are connected as emitter and as collector by means of the first and the second path conductor 17, 18. The current ID flows through the second path conductor 18. The current ID thus corresponds to a collector current. For the measurement shown in FIG. 4, the third region 13 was provided with a control terminal. The third region 13 can be designated as base. Through the terminal of the base, a base current flows. The amplification factor BETA of a protective structure 10 used as bipolar transistor is defined as ratio from collector current ID to base current.

Advantageously, field-effect transistors that have a maximum permissible control voltage of 3.3 V are protected with the protective structure 10. The protective structure 10 has two terminals, namely the first and the second path conductor 17, 18 that are connected to the control terminal and the substrate terminal of the transistor 20, 40 that is to be protected.

Both the structure 24 that is to be protected and also the protective structure 10 can be operated in an isolated logic circuit, wherein the common well for the protective structure 10 and the transistors 25, 40 is the deep well 19 in a p-substrate 20. In the isolated logic circuit, a voltage between the electrode 29 and the substrate terminal 30 of the transistor 25 that is to be protected could be, after an ESD event, above the value of 3.3 V for a long time. This is also the case when the ESD event lasts only a few nanoseconds. Due to the long-lasting overvoltage on the electrode 29 that is the control terminal, an effective protective structure that connects a control terminal of the structure 24 that is to be protected to a terminal for an electrical ground and has a low breakdown voltage is required for the structure 24 that is to be protected. This is given by the protective structure 10 according to the invention.

Figure 5A:
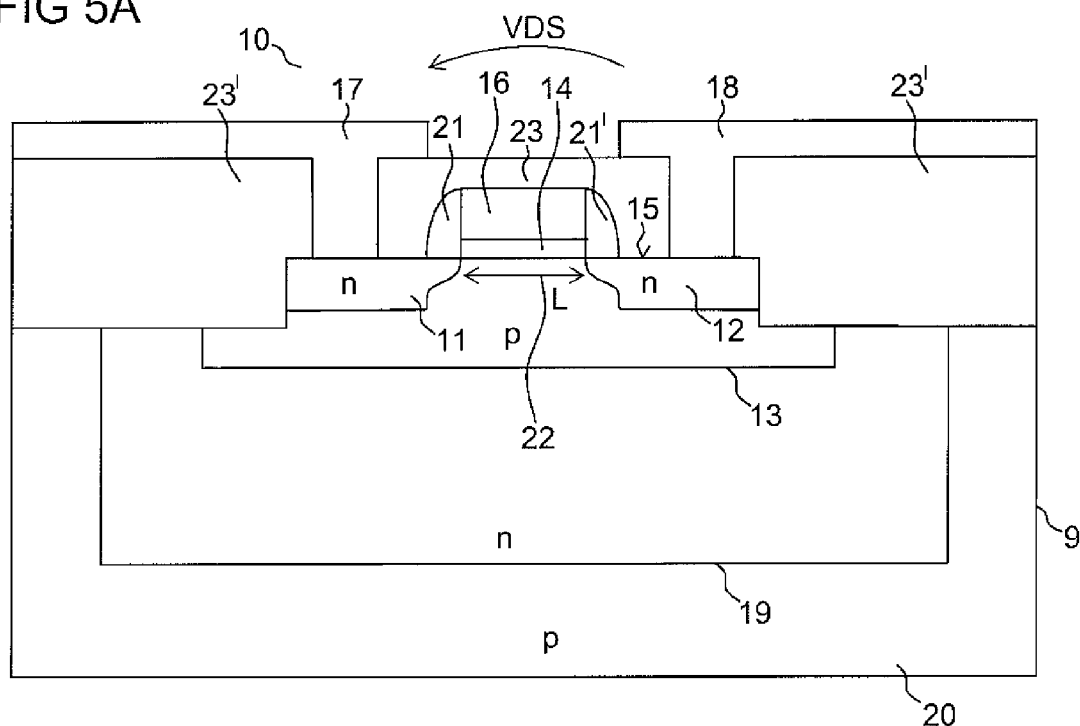
FIGS. 5A and 5B are example embodiments of a semiconductor body with a protective structure according to an embodiment of the invention in cross section and in plan view.
Figure 5B:
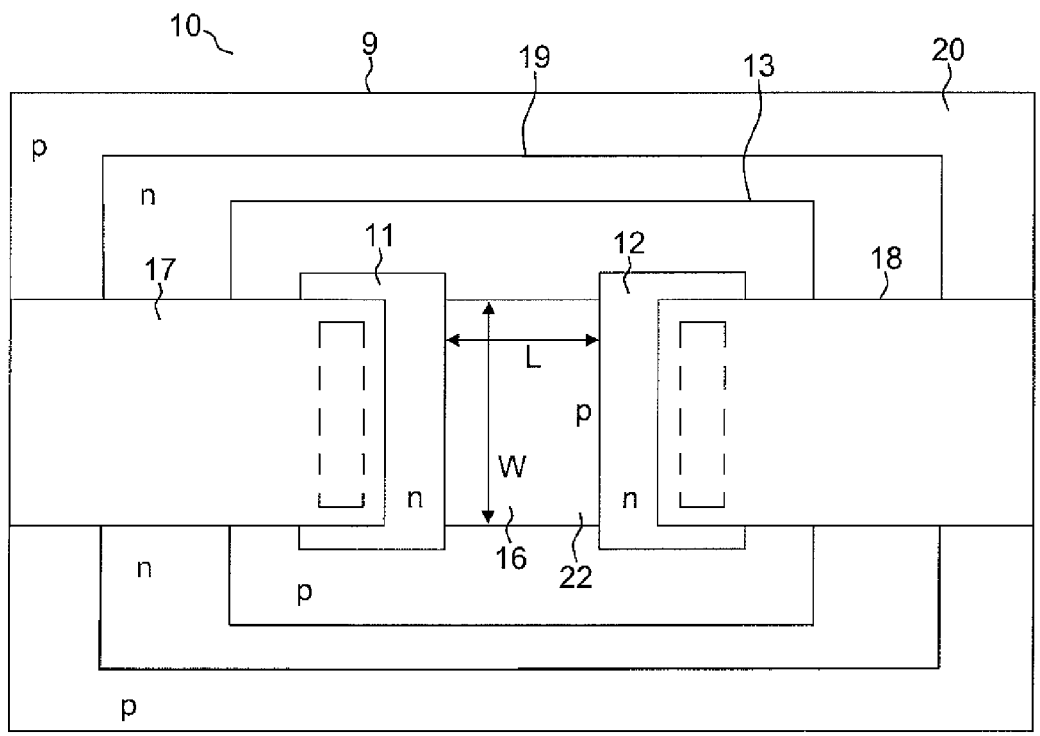

FIGS. 5A and 5B show an example embodiment of a semiconductor body with a protective structure according to the invention in cross section and in plan view. FIGS. 5A and 5B show a refinement of the embodiments of a semiconductor body shown in the FIGS. 1A to 1D. The protective structure 10 has the first and the second region 11, 12 that are arranged in the third region 13. The third region 13 is free of well terminals. The third region 13 is free of an ohmic contact. No path conductor is led directly to the third region 13. The first and the second region 11, 12 are contacted by means of the first and the second path conductor 17, 18. The third region 13 is arranged, in turn, in the deep well 19. The third region 13 comprises the channel region 22 above which the insulator 14 and the electrode 16 are arranged.

The electrode 16 is completely isolated. For this purpose, the electrode 16 is encapsulated completely by insulating material. In the cross section according to FIG. 5A, the electrode 16 is enclosed by the insulator 14, a first side insulator 21, a second side insulator 21', and a cover insulator 23. The first and the second side insulator 21, 21' is arranged on the two sides of the electrode 16. The first side insulator 21 is arranged on the left side and the second side insulator 21' is arranged on the right sides of the electrode 16. The cover insulator 23 is located on the electrode 16. The insulator 14 is arranged between the electrode 16 and the channel region 22. The cover insulator 23' also covers the first surface 15 in the region of the first and the second region 11, 12 and also a surface of the third region 13, the deep well 19, and the substrate 20. In the region of the substrate 20 and the deep well 19, the cover insulator 23' is realized as a shallow trench isolator. The first and the second path conductor 18, 19 are each connected to the first and the second region 11, 12, respectively, in an electrically conductive way through a contact hole in the cover insulator 23'.

FIG. 5B shows the semiconductor body 9 shown in FIG. 5A in a plan view. A surface of the electrode 16 corresponds approximately to a surface of the channel region 22 in the plan view. The electrode 16 is not contacted by means of a path conductor. The channel region 22 has a width W and a length L. The length L is a spacing between the first and the second region 11, 12. The first and the second path conductor 17, 18 connect the first and the second region 11, 12, respectively, to other structures not shown in FIG. 5B. For this purpose, the first and the second path conductor 17, 18 are present up to the edge of the cutout of the semiconductor body 9 shown in FIG. 5B. The third region 13 has a rectangular construction in the plan view and encloses the first and the second region 11, 12. The surface of the third region 13 is free of a path-conductor terminal. Finally, the first and the second region 11, 12 within the third region 13 are contacted with path conductors 17, 18. The deep well 19 is realized with a rectangular shape in the plan view. The deep well 19 encloses the third region 13. The deep well 19 is constructed free from well terminals. No terminal leads to the deep well 19.

In a not-shown, alternative embodiment, the cover insulator 23' is realized not as a shallow trench isolator, but instead by means of a local oxidation of silicon, abbreviated LOCOS.

Alternatively, the deep well 19 is contacted in an electrically conductive way by means of the additional substrate terminal 47. Alternatively, the deep well 19 comprises the structure 24 that is to be protected.

Advantageously, through the complete isolation of the electrode 16, this has an electrically floating construction. Because the third region 13 has no ohmic connection, the third region 13 is also electrically floating.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor body comprising:
a protective structure comprising:
a first region and a second region which have a first conductivity type,
a third region that has a second conductivity type opposite the first conductivity type, wherein the third region is constructed as a first well and with floating potential, the third region having no ohmic contact to a path conductor,
an insulator that is arranged on the semiconductor body, and
an electrode that is arranged on the insulator and is completely encapsulated by insulating material, wherein the first and the second regions are arranged spaced apart in the third region, so that a current flow from the first region to the second region is made possible for the limiting of a voltage difference between the first and the second regions and the semiconductor body comprises a deep well in which the third region is arranged;

a structure that is to be protected by and operatively coupled to the protective structure;

a first path conductor; and a second path conductor, wherein the first path conductor connects the first region of the protective structure to a terminal of the structure that is to be protected in an electrically conductive way, and the second path conductor connects the second region of the protective structure to a supply voltage terminal in an electrically conductive way.

2. The semiconductor body according to claim 1, wherein the electrode is encapsulated by the insulator, a first side insulator, a second side insulator, and a cover insulator.

3. The semiconductor body according to claim 1, wherein the protective structure comprises a channel region that is arranged in the third region between the first and the second regions and has a channel length L that is the distance between the first and the second regions.

4. The semiconductor body according to claim 3, wherein the channel length L has a value less than 1 μm.

5. The semiconductor body according to claim 3, wherein the insulator is arranged on the channel region.

6. The semiconductor body according to claim 1, wherein the protective structure is based on the field-effect transistor principle.

7. The semiconductor body according to claim 1, wherein the first path conductor is connected to the second path conductor in an electrically conductive way.

8. The semiconductor body according to claim 1, wherein the structure that is to be protected comprises a transistor, and the first path conductor is connected to an electrode of the transistor.

9. The semiconductor body according to claim 1, wherein the deep well comprises a fourth region in which the structure that is to be protected is arranged, the fourth region has the second conductivity type, and the fourth region is realized as a second well.

10. The semiconductor body according to claim 1, wherein a thickness of an insulator of the protective structure is approximately equal to a thickness of an insulator of the structure that is to be protected.

11. A method for the production of a protective structure and a structure that is to be protected in a semiconductor body, comprising:

production of a first region and a second region of the semiconductor body that are comprised by the protective structure that have a first conductivity type and that are arranged spaced apart from each other in a third region of the semiconductor body having a second conductivity type such that a current flow is made possible from the first region to the second region for the limiting of a voltage difference between the first and the second regions, wherein the semiconductor body comprises a deep well in which the third region is arranged, the third region is constructed as a first well and has a floating potential, the third region having no ohmic contact to a path conductor; and production of an insulator on the semiconductor body and an electrode on the insulator such that the electrode is completely encapsulated by insulating material, wherein the production of the first region and the second region of the protective structure is performed simultaneously with the production of a first region and a second region of the structure that is to be protected, and wherein the deep well comprises a fourth region in which the structure that is to be protected is arranged, the fourth region has the second conductivity type, and the fourth region is provided as a second well.

12. The method according to claim 11, wherein for the production of the protective structure:

an insulator layer is produced on the semiconductor body;

an electrode layer is deposited on the insulator layer;

by means of a photolithographic process and a subsequent etching process, the electrode layer and the insulator layer are structured such that an electrode and an insulator of the protective structure are produced; and dopants are introduced into the semiconductor body, wherein the electrode of the protective structure is used as masking for the introduction of the dopants for the production of the first and the second regions of the protective structure.

13. A semiconductor body with a protective structure, wherein the protective structure comprises:

a first region and a second region which have a first conductivity type;

a third region that has a second conductivity type opposite the first conductivity type, wherein the third region is constructed as a first well and with floating potential, the third region having no ohmic contact to a path conductor;

an insulator that is arranged on the semiconductor body; and an electrode that is arranged on the insulator and is completely encapsulated by insulating material, wherein the electrode is not attached to a path conductor, the first and the second regions are arranged spaced apart in the third region, so that a current flow from the first region to the second region is made possible for the limiting of a voltage difference between the first and the second regions, and the semiconductor body comprises a deep well in which the third region is arranged.

14. A semiconductor body comprising:

a protective structure comprising:

a first region and a second region which have a first conductivity type, a third region that has a second conductivity type opposite the first conductivity type, wherein the third region is constructed as a first well and with floating potential, the third region having no ohmic contact to a path conductor, an insulator that is arranged on the semiconductor body, and an electrode that is arranged on the insulator and is completely encapsulated by insulating material, wherein the first and the second regions are arranged spaced apart in the third region, so that a current flow from the first region to the second region is made possible for the limiting of a voltage difference between the first and the second regions and the semiconductor body comprises a deep well in which the third region is arranged; and a structure that is to be protected by and operatively coupled to the protective structure, wherein the deep well comprises a fourth region in which the structure that is to be protected is arranged, the fourth region has the second conductivity type, and the fourth region is realized as a second well.

\* \* \* \* \*